(12) United States Patent
Sumino et al.

(10) Patent No.: US 8,476,614 B2
(45) Date of Patent: Jul. 2, 2013

(54) MEMORY DEVICE AND FABRICATION PROCESS THEREOF

(75) Inventors: Jun Sumino, Kanagawa (JP); Shuichiro Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 9 days.

(21) Appl. No.: 12/906,214

(22) Filed: Oct. 18, 2010

(65) Prior Publication Data
US 2011/0095255 A1    Apr. 28, 2011

(30) Foreign Application Priority Data
Oct. 26, 2009    (JP) ................................. 2009-245597

(51) Int. Cl.
*H01L 47/00*    (2006.01)

(52) U.S. Cl.
USPC ........ 257/4; 257/2; 257/5; 257/390; 257/503; 257/528; 365/148; 365/163; 438/95; 438/98; 438/102; 438/139

(58) Field of Classification Search
USPC .................. 257/5, E45.002, 2, E21.004, 390, 257/503, 528; 438/382, 95, 98, 102, 139; 365/163, 148
See application file for complete search history.

(56) References Cited

U.S. PATENT DOCUMENTS

| 6,339,544 | B1 | 1/2002 | Chiang et al. | |
| 6,815,744 | B1 | 11/2004 | Beck et al. | |
| 2006/0072370 | A1* | 4/2006 | Kuh et al. | 365/232 |
| 2008/0068879 | A1* | 3/2008 | Ahn et al. | 365/163 |
| 2008/0197334 | A1* | 8/2008 | Lung | 257/2 |

FOREIGN PATENT DOCUMENTS

JP    2002-537627    11/2002

* cited by examiner

*Primary Examiner* — Telly Green
(74) *Attorney, Agent, or Firm* — Dentons US LLP

(57) ABSTRACT

A memory device that includes a resistive-change memory element, the memory device includes: a first memory element that includes a first resistive-change layer and a first electrode connected to the first resistive-change layer; and a second memory element that includes a second resistive-change layer and a second electrode connected to the second resistive-change layer, wherein at least one of the thickness and the material of the second resistive-change layer and the area of the second electrode in contact with the second resistive-change layer is different from the corresponding one of the thickness and the material of the first resistive-change layer and the area of the first electrode in contact with the first resistive-change layer.

6 Claims, 15 Drawing Sheets

MEMORY DEVICE AND FABRICATION PROCESS THEREOF

BACKGROUND OF THE INVENTION

1. Field of the Invention

The present invention relates to memory devices that use resistive-change memory elements, and fabrication processes of such memory devices.

2. Description of the Related Art

Semiconductor devices that include nonvolatile memory such as EEPROM (Electrically Erasable and Programmable ROM) and flash memory have been commonly used in a wide range of fields.

Improving reliability such as rewrite count and data retention durability, and miniaturization of the memory structure pose significant challenges to the nonvolatile memory.

Resistive-change nonvolatile memory has gained attention as having advantages in reliability and miniaturization over the structure of the currently marketed flash memory as represented by the floating-type structure.

Regarding such resistive-change nonvolatile memory, for example, ReRAM (Resistive Random Access Memory) and PCRAM (Phase Change Random Access Memory) have been proposed (see, for example, JP-T-2002-537627 and U.S. Pat. No. 6,339,544; the term "JP-T" as used herein means a published Japanese translation of a PCT patent application).

The resistive-change nonvolatile memory has a simple structure and high-speed rewrite performance, and is considered suitable for achieving high performance and high integration with the use of multivalue technology.

SUMMARY OF THE INVENTION

In the resistive-change memory element, the material and structure of the resistive-change layer, and the material and structure of the plug electrode connected thereto are known to greatly influence operating characteristics such as rewrite speed, and reliability characteristics such as rewrite durability and data retention.

However, these characteristics often represent a trade-off, and it has been difficult to satisfy all characteristics at the same time.

Accordingly, there is a need for a memory device and a fabrication process thereof with which operating characteristics such as high-speed rewrite, and reliability characteristics such as data retention can be realized at the same time using a resistive-change memory element.

According to an embodiment of the present invention, there is provided a memory device that includes a resistive-change memory element. The memory device includes a first memory element that includes a first resistive-change layer and a first electrode connected to the first resistive-change layer. The memory device also includes a second memory element that includes a second resistive-change layer and a second electrode connected to the second resistive-change layer, wherein the second resistive-change layer has a thickness different from a thickness of the first resistive-change layer.

The memory device of the embodiment of the invention is configured to include the first memory element, and the second memory element whose second resistive-change layer has a thickness different from the thickness of the first resistive-change layer of the first memory element. By having different thicknesses for the resistive-change layers, the first and second memory elements can have different rewrite speeds and different data retention characteristics.

Rewrite speed is faster and data retention characteristic is lower in the memory element having the thinner resistive-change layer. In the memory element having the thicker resistive-change layer, rewrite speed is slower and data retention characteristic is higher.

In short, the memory device can be configured to include a memory element capable of high-speed rewrite operation, and a memory element having a superior data retention characteristic.

According to another embodiment of the invention, there is provided a memory device that includes a resistive-change memory element. The memory device includes a first memory element that includes a first resistive-change layer that undergoes changes in resistance, and a first electrode connected to the first resistive-change layer. The memory device also includes a second memory element that includes a second resistive-change layer that undergoes changes in resistance, and a second electrode connected to the second resistive-change layer, wherein the material of the second resistive-change layer is different from the material of the first resistive-change layer.

The memory device of the embodiment of the invention is configured to include the first memory element, and the second memory element in which the material of the second resistive-change layer is different from the material of the first resistive-change layer of the first memory element.

With this configuration, the first and second memory elements whose materials for the resistive-change layers are different can have different rewrite speeds and different data retention characteristics.

Rewrite speed is faster and data retention characteristic is lower in the memory element using a certain material for the resistive-change layer. In the memory element using some other material for the resistive-change layer, rewrite speed is slower and data retention characteristic is higher.

In short, the memory device can be configured to include a memory element capable of high-speed rewrite operation, and a memory element having a superior data retention characteristic.

According to still another embodiment of the invention, there is provided a memory device that includes a resistive-change memory element. The memory device includes a first memory element that includes a first resistive-change layer that undergoes changes in resistance, and a first electrode connected to the first resistive-change layer. The memory device also includes a second memory element that includes a second resistive-change layer that undergoes changes in resistance, and a second electrode connected to the second resistive-change layer, wherein the area of the second electrode in contact with the second resistive-change layer is different from the area of the first electrode in contact with the first resistive-change layer.

The memory device of the embodiment of the invention is configured to include the first memory element, and the second memory element in which the area of the second electrode in contact with the second resistive-change layer is different from the area of the first electrode in contact with the first resistive-change layer of the first memory element.

With this configuration, the first and second memory elements whose areas of the electrode in contact with the resistive-change layer are different can have different rewrite speeds and different data retention characteristics.

Rewrite speed is faster and data retention characteristic is lower in the memory element in which the area of the electrode in contact with the resistive-change layer is smaller and thus has a concentrated electric field. In the memory element in which the area of the electrode in contact with the resistive-change layer is larger and thus has an attenuated electric field, rewrite speed is slower and data retention characteristic is higher.

In short, the memory device can be configured to include a memory element capable of high-speed rewrite operation, and a memory element having a superior data retention characteristic.

According to yet another embodiment of the invention, there is provided a memory device that includes a resistive-change memory element. The memory device includes a first memory element that includes a first resistive-change layer that undergoes changes in resistance, and a first electrode connected to the first resistive-change layer. The memory device also includes a second memory element that includes a second resistive-change layer that undergoes changes in resistance, and a second electrode connected to the second resistive-change layer, wherein the material of the second electrode is different from the material of the first electrode of the first memory element.

The memory device of the embodiment of the invention is configured to include the first memory element, and the second memory element in which the material of the second electrode is different from the material of the first electrode of the first memory element.

With this configuration, the first and second memory elements whose electrode materials are different can have different rewrite speeds and different data retention characteristics.

Rewrite speed is faster and data retention characteristic is lower in the memory element using a certain material for the electrode. In the memory element using some other material for the electrode, rewrite speed is slower and data retention characteristic is higher.

In short, the memory device can be configured to include a memory element capable of high-speed rewrite operation, and a memory element having a superior data retention characteristic.

According to still yet another embodiment of the invention, there is provided a process for fabricating a memory device that includes a resistive-change memory element, the resistive-change memory element including a resistive-change layer that undergoes changes in resistance, and an electrode connected to the resistive-change layer. The process includes the steps of: forming a resistive-change material layer of the resistive-change layer over a whole memory region; and removing the resistive-change material layer in a portion of the memory region. The process further includes the step of forming the resistive-change material layer over the whole memory region so as to form a first memory element that includes the resistive-change layer as a thin layer formed from the resistive-change material layer, and a second memory element that includes the resistive-change layer as a thick layer formed from the resistive-change material layer.

In the process for fabricating a memory device according to the embodiment of the invention, the resistive-change material layer in a portion of the memory region is removed, and the resistive-change material layer is formed over the whole memory region. Thus, the resistive-change layer formed from the resistive-change material layer is thinner in the portion of the memory region from which the resistive-change material layer is removed, and is thicker in other portions where the resistive-change material layer is not removed. In this manner, the first and second memory elements are formed to include a thin resistive-change layer and a thick resistive-change layer, respectively, formed from the resistive-change material layer. The first memory element with the thinner resistive-change layer has a faster rewrite speed and a lower data retention characteristic. Rewrite speed is slower and data retention characteristic is higher in the second memory element having the thicker resistive-change layer.

In short, the memory device can be fabricated to include a memory element capable of high-speed rewrite operation, and a memory element having a superior data retention characteristic.

According to further another embodiment of the invention, there is provided a process for fabricating a memory device that includes a resistive-change memory element, the resistive-change memory element including a resistive-change layer that undergoes changes in resistance, and an electrode connected to the resistive-change layer. The process includes the steps of: forming a second resistive-change material layer of the resistive-change layer over a whole memory region; and removing the second resistive-change material layer in a portion of the memory region. The process further includes the step of forming a first resistive-change material layer of the resistive-change layer using a material different from the material of the second resistive-change material layer over the whole memory region. As a result of this step, a first memory element including the resistive-change layer formed from the first resistive-change material layer, and a second memory element including the resistive-change layer as a laminate of the second resistive-change material layer and the first resistive-change material layer are formed.

In the process for fabricating a memory device according to the embodiment of the invention, the second resistive-change material layer in a portion of the memory region is removed, and the first resistive-change material layer of the resistive-change layer is formed over the whole memory region using a material different from that used for the second resistive-change material layer. Thus, a thin resistive-change layer is formed from the first resistive-change material layer in the portion of the memory region from which the second resistive-change material layer is removed. In other portions where the second resistive-change material layer is not removed, a thick resistive-change layer is formed as a laminate of the second resistive-change material layer and the first resistive-change material layer. In this manner, the first memory element is formed to include a thinner resistive-change layer formed from the first resistive-change material layer, and the second memory element is formed to include a thicker resistive-change layer as a laminate of the second resistive-change material layer and the first resistive-change material layer. The first memory element with the thinner resistive-change layer has a faster rewrite speed, and a lower data retention characteristic. Rewrite speed is slower and data retention characteristic is higher in the second memory element having the thicker resistive-change layer.

In short, the memory device can be fabricated to include a memory element capable of high-speed rewrite operation, and a memory element having a superior data retention characteristic.

According to still further another embodiment of the invention, there is provided a process for fabricating a memory device that includes a resistive-change memory element, the resistive-change memory element including a resistive-change layer that undergoes changes in resistance, and an electrode connected to the resistive-change layer. The process includes the steps of: forming a resistive-change material layer of the resistive-change layer over a whole memory region; forming a mask that covers a portion of the memory region; and doping the resistive-change material layer with a material in the portion of the memory region not covered with the mask. The process further includes the step of removing the mask to form a first memory element that includes the resistive-change layer formed from the resistive-change material layer, and a second memory element that includes the resistive-change layer formed from the resistive-change material layer doped with the material.

In the process for fabricating a memory device according to the embodiment of the invention, the resistive-change material layer is doped with a material in the unmasked portion of the memory region. Thus, the resistive-change material layer doped with a material is formed in the unmasked portion of the memory region, and the resistive-change material layer not doped with a material is formed in the masked portion of the memory region. In this manner, the first memory element is formed to include the resistive-change layer formed from the resistive-change material layer, and the second memory element is formed to include the resistive-change layer formed from the resistive-change material layer doped with the material. By varying the material of the resistive-change layer, the first and second memory elements can have different rewrite speeds and different data retention characteristics.

In short, the memory device can be fabricated to include a memory element capable of high-speed rewrite operation, and a memory element having a superior data retention characteristic.

According to yet further another embodiment of the invention, there is provided a process for fabricating a memory device that includes a resistive-change memory element, the resistive-change memory element including a resistive-change layer that undergoes changes in resistance, and an electrode connected to the resistive-change layer. The process includes the steps of: forming an electrode-forming aperture in an insulating layer at portions of a whole memory region where the memory element is to be formed; and widening the aperture in a part of the memory region by etching. The process further includes the steps of forming an electrode material over the whole memory region so as to plug the apertures; and removing the electrode material on the insulating layer so as to form electrodes of different sizes. The process further include the step of forming the resistive-change layer in contact with the electrodes so as to form a first memory element and a second memory element having the electrodes of different sizes.

In the process for fabricating a memory device according to the embodiment of the invention, the aperture in a part of the memory region is widened by etching, and an electrode material is formed over the whole memory region so as to plug the apertures. Thus, electrodes of different sizes are formed, including a large electrode formed in the part of the memory region having the wide aperture, and a small electrode formed in other parts of the memory region having an unwidened aperture. The resistive-change layer is formed in contact with the electrodes to form the first and second memory elements of different electrode sizes. The larger electrode formed in the aperture-widened portion of the memory region has a greater area of contact with the resistive-change layer, and thus the area of contact is different for the first memory element and the second memory element. Because the area of the electrode in contact with the resistive-change layer is different for the first and second memory elements, the first and second memory elements can have different rewrite speeds and different data retention characteristics. The memory element having the electrode with a smaller contact area with the resistive-change layer has a faster rewrite speed and a lower data retention characteristic. Rewrite speed is slower and data retention characteristic is higher in the memory element having the electrode with a larger contact area with the resistive-change layer.

In short, the memory device can be fabricated to include a memory element capable of high-speed rewrite operation, and a memory element having a superior data retention characteristic.

According to still yet further another embodiment of the invention, there is provided a process for fabricating a memory device that includes a resistive-change memory element, the resistive-change memory element including a resistive-change layer that undergoes changes in resistance, and an electrode connected to the resistive-change layer. The process includes the steps of: forming a first-electrode-forming first aperture in an insulating layer in a region of a memory region where a first memory element is to be formed; and forming a first electrode material so as to plug the first aperture. The process further includes the steps of forming a second-electrode-forming second aperture in the insulating layer in a region of the memory region where a second memory element is to be formed; and forming a second electrode material different from the first electrode material so as to plug the second aperture. The process further includes the steps of removing the first electrode material and the second electrode material on the insulating layer so as to form the first electrode and the second electrode; and forming the resistive-change layer in contact with the first electrode and the second electrode. As a result of this step, the first memory element including the first electrode, and the second memory element including the second electrode are formed.

In the process for fabricating a memory device according to the embodiment of the invention, the first aperture used to form the first electrode is formed in the insulating layer in a region of the memory region where the first memory element is to be formed, and the first electrode material is formed so as to plug the first aperture. Further, the second aperture used to form the second electrode is formed in the insulating layer in a region of the memory region where the second memory element is to be formed, and the second electrode material different from the first electrode material is formed so as to plug the second aperture. The first electrode material and the second electrode material on the insulating layer are removed to form the first electrode and the second electrode, respectively, and the resistive-change layer is formed in contact with the first electrode and the second electrode. In this manner, the first and second memory elements are formed to include the first electrode and the second electrode, respectively. By varying the electrode material, the first and second memory elements can have different rewrite speeds and different data retention characteristics.

In short, the memory device can be fabricated to include a memory element capable of high-speed rewrite operation, and a memory element having a superior data retention characteristic.

According to the foregoing embodiments of the invention, the memory device can be configured to include a memory element capable of high-speed rewrite operation, and a memory element having a superior data retention characteristic.

Further, according to the foregoing embodiments of the invention, the fabrication process enables fabrication of a memory device that includes a memory element capable of high-speed rewrite operation, and a memory element having a superior data retention characteristic.

Thus, with the embodiments of the invention, a system that uses different memory types of completely different structures, for example, such as DRAM and flash memory, can be realized using the same resistive-change memory elements.

This makes it possible to reduce the cost and power consumption of the system.

Further, the embodiments of the invention allow for selection of different combinations of the thickness and the material, and thus affords more freedom in memory design with regard to rewrite performance and data retention characteristic, making it possible to accommodate many variations.

DESCRIPTION OF THE PREFERRED EMBODIMENTS

Figure 1:
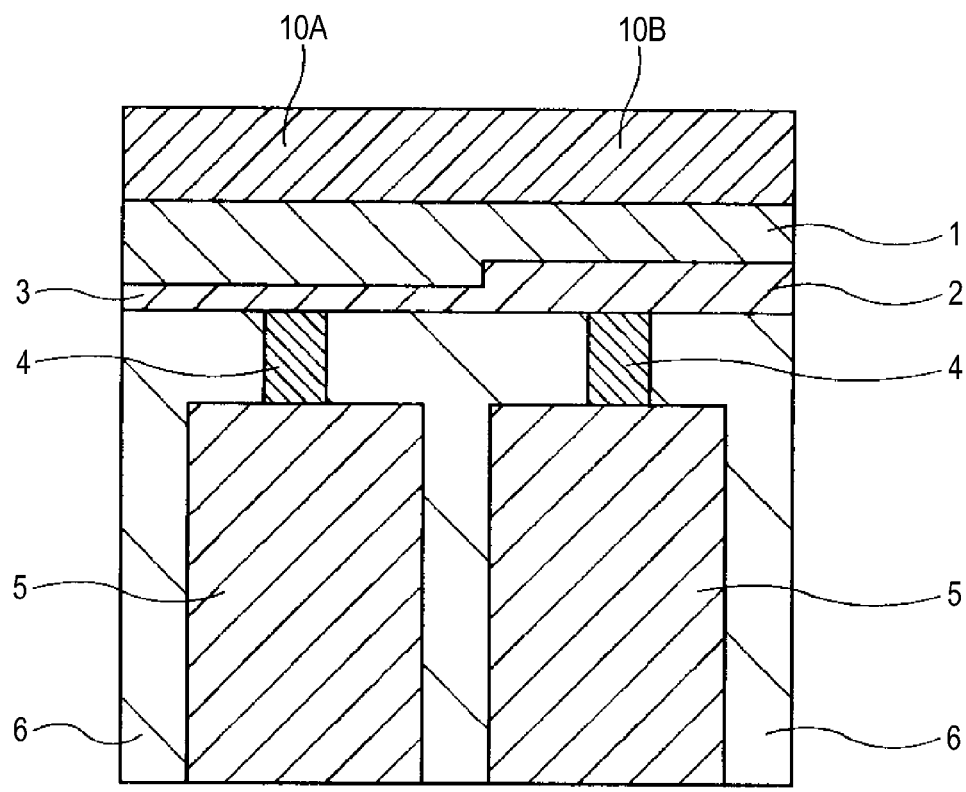
FIG. 1 is a schematic structural view (cross sectional view of a relevant portion) of a memory device of First Embodiment of the invention.

The best mode for carrying out the invention (hereinafter, "embodiments") is described below. Descriptions will be given in the following order.

1. Overview of the Invention
2. First Embodiment
3. Second Embodiment
4. Third Embodiment
5. Fourth Embodiment
6. Fifth Embodiment
7. Variation
8. Application 1. Overview of the Invention Before describing specific embodiments of the invention, an overview of the invention is given first.

In the invention, a memory device with resistive-change memory elements of partially different configurations is formed to provide a memory element capable of high-speed rewrite operation, and a memory element that has a superior data retention characteristic.

Specifically, the memory device is configured to include a first memory element and a second memory element of partially different configurations.

For example, the different configurations may be different thicknesses or different materials of the resistive-change layers that undergo changes in resistance (i.e., memory layers that undergo resistive changes to store information), or different dimensions or different materials of the electrodes connected to the resistive-change layers (memory layers).

Applicants of the present application have proposed a memory element that includes a resistive-change layer formed by an insulator such as an oxide, and a resistive-change material supply layer (also called an ion source layer) formed adjacent to the resistive-change layer, and that contains elements, such as Ag, Cu, and Zn, that can move as ions. The memory element is a type of resistive-change memory element, details of which are described in, for example, JP-A-2007-157941.

In this type of memory element, the elements, such as Ag, Cu, and Zn, contained in the resistive-change material supply layer ionize and diffuse into the resistive-change layer in response to applied positive potential to the resistive-change material supply layer. These elements accumulate in the resistive-change layer, or deposit by binding to electrons at the portion of the resistive-change layer connected to an electrode. As a result, the resistance value of the resistive-change layer is lowered.

Applying a negative potential to the resistive-change material supply layer in this state causes the elements, such as Ag, Cu, and Zn, to ionize again and return to the resistive-change material supply layer, with the result that the resistance value of the resistive-change layer is increased. The resistive-change material supply layer is a conductor, and the resistive-change layer is an insulator.

The resistance value of the resistive-change layer is varied in this manner, and the state of the resistance value varied in this manner is retained, enabling the memory element to store information in the form of resistance values.

The following describes specific examples of the memory element of this type along with typical characteristics and measurement values, based on the overview described above.

(1) Varying the Thickness of the Resistive-Change Layer (Memory Layer)

The resistive-change layer is formed using the same material for the first memory element and the second memory element. The thickness of the resistive-change layer is varied so that it is thicker for one of the memory elements, and is thinner for the other memory element.

The memory element with the thicker resistive-change layer has a superior data retention characteristic.

The memory element with the thinner resistive-change layer is capable of high-speed rewrite operation.

Figure 12:
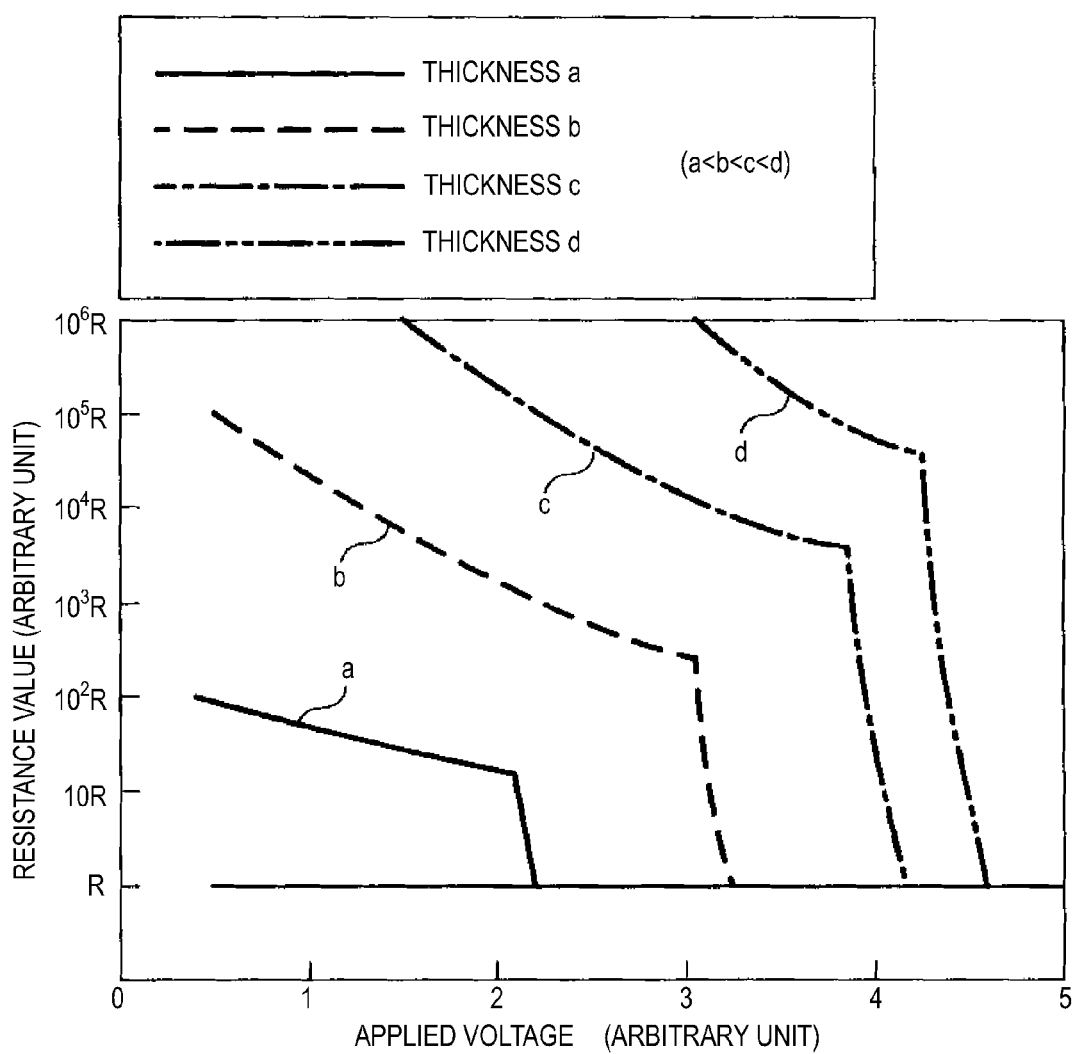
FIG. 12 is a diagram schematically representing the relationship between applied voltage to a memory cell and resistance value of the memory cell for different thicknesses of a resistive-change layer.

FIG. 12 schematically represents the relationship between applied voltage to the memory cell and resistance value of the memory cell for different thicknesses of the resistive-change layer in the resistive-change memory element of the type described above.

FIG. 12 represents the resistance value of the memory cell with varying applied voltages to the memory cell for different thicknesses a, b, c, d (a<b<c<d) of the resistive-change layer. In the resistive-change memory element, the low-resistance state resistance value is substantially the same (resistance value R), regardless of the thickness of the resistive-change layer.

The resistance value in the high-resistance state is the lowest at about $10^2$ R for the thinnest thickness a. The resistance value abruptly decreases at applied voltages above 2.

The resistance value in the high-resistance state is $10^5$ R to $10^6$ R for slightly thicker thickness b. The resistance value abruptly decreases at applied voltages above 3.

Similarly, the resistance value in the high-resistance state increases as the thickness increases from thickness c to thickness d, and the applied voltage that causes an abrupt decrease in resistance value also increases as the thickness becomes thicker.

In other words, the resistance value in the high-resistance state is smaller for thinner thicknesses, and the applied voltage (corresponding to the write threshold voltage) that causes an abrupt decrease in resistance value is also smaller for thinner thicknesses. Conversely, the resistance value in the high-resistance state is greater for thicker thicknesses, and the applied voltage (corresponding to write threshold voltage) that causes an abrupt decrease in resistance value is also greater for thicker thicknesses.

Thinner elements require low write threshold voltage, and thus enable low-voltage writing. Thus, high-speed rewrite operation can be realized.

Thicker elements have high resistance values in the high-resistance state, and thus there is a large difference from the resistance values in the low-resistance state. The large difference in resistance value enables the written resistance value, corresponding to the written data, to be stably held for extended time periods.

(2) Varying the Material of the Resistive-Change Layer (Memory Layer)

The resistive-change layer is configured using different materials for the first memory element and the second memory element.

For example, the speed of rewrite operation can be increased with the use of a relatively low-resistant material for the resistive-change layer, and data retention characteristic improves with the use of a relatively high-resistant material for the resistive-change layer.

The resistive-change layer materials may be combined in different ways so that, for example, the constituent elements of the resistive-change layer become totally or partially different, or the proportions of the constituent elements of the resistive-change layer become different.

In addition to using different materials for the resistive-change layer, the thickness of the resistive-change layer also may be varied as in (1).

The memory elements with different materials for the resistive-change layer are generally formed by separately forming the layers using different materials.

Other methods include introducing a different substance to only one of the layers of the same material, or introducing different substances to the layers of the same material. For example, ion implantation or reaction between different substances can be used.

Figure 13:
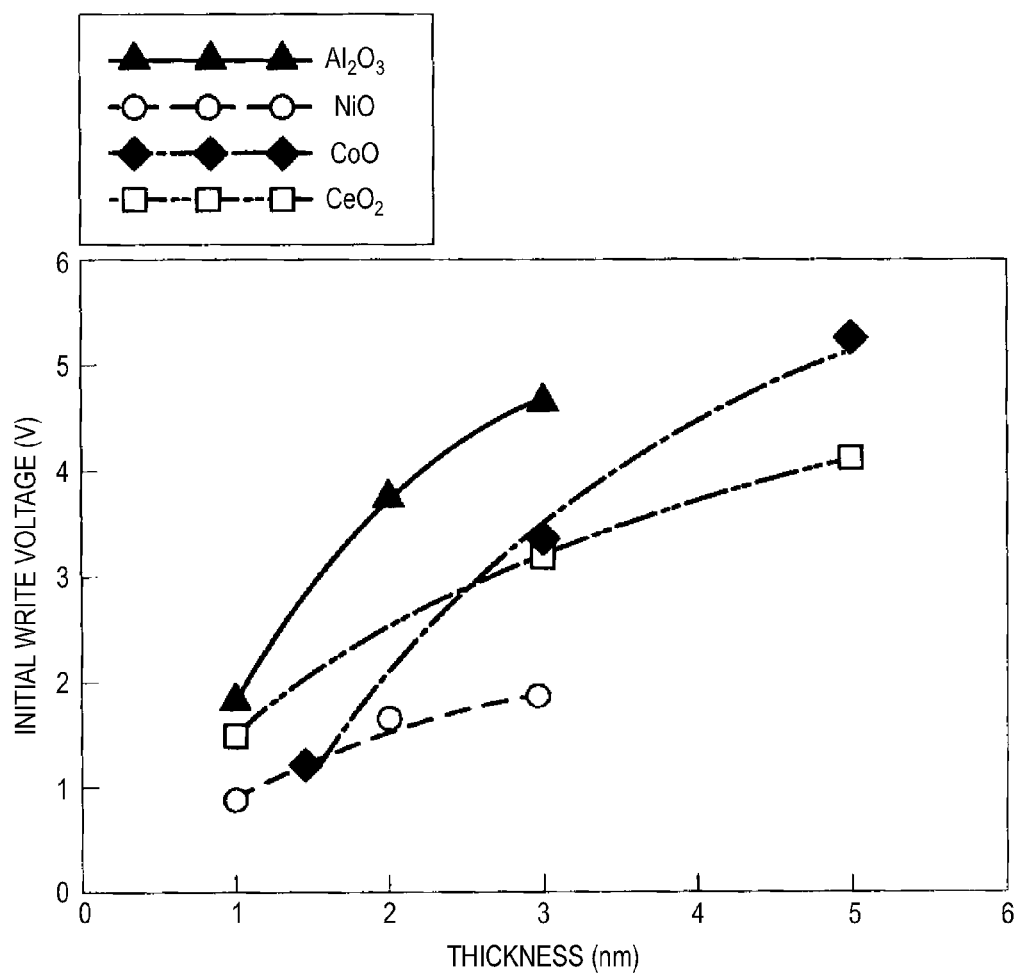
FIG. 13 is a diagram representing the relationship between the thickness of a resistive-change layer and initial write voltage for different materials of the resistive-change layer.

FIG. 13 represents the result of the measurement of initial write voltage (corresponding to write threshold voltage) with varying thicknesses of the resistive-change layers of different materials that use various oxides in the resistive-change memory element of the type described above.

As can be seen in FIG. 13, the relationship between thickness and initial write voltage is different for the different materials $Al_2O_3$, NiO, CoO, and $CeO_2$.

For example, at the thickness of 2 nm, NiO has the smallest write voltage, and $Al_2O_3$ has the largest write voltage. Thus, the memory element using NiO for the resistive-change layer is capable of high-speed rewrite operation, and the memory element using $Al_2O_3$ for the resistive-change layer has an improved data retention characteristic.

The resistive-change memory element of the type described above was examined with regard to changes in characteristics that occurred as a result of doping the resistive-change layer with elements.

Figure 14A:
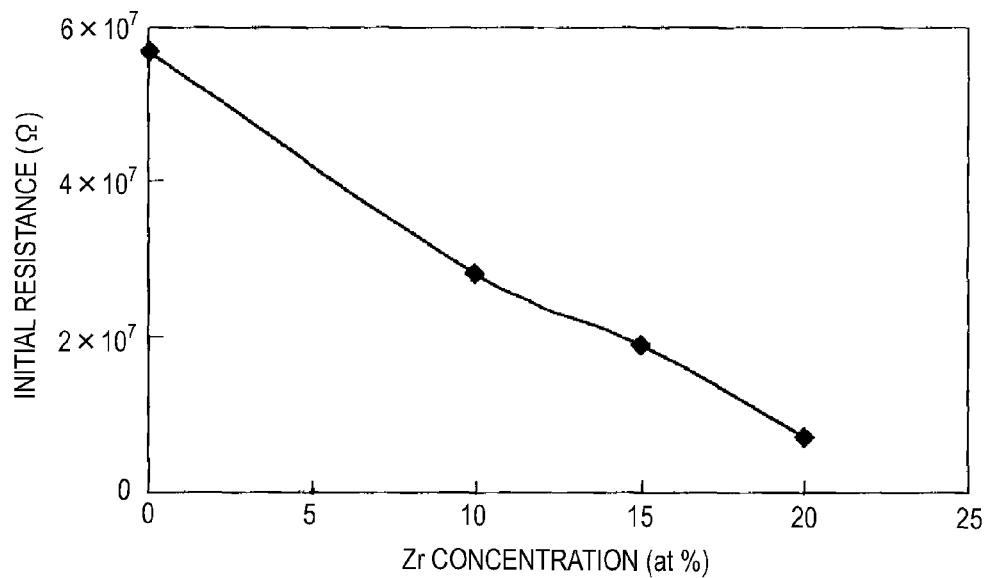
FIG. 14A is a diagram representing the relationship between doped Zr concentration in a resistive-change layer and initial resistance.
Figure 14B:
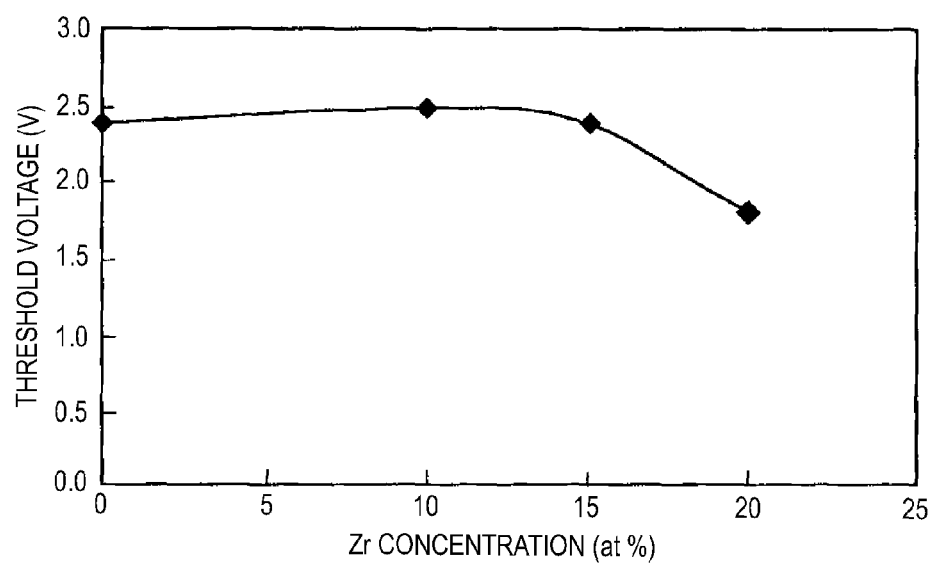
FIG. 14B is a diagram representing the relationship between doped Zr concentration and threshold voltage (threshold voltage for writing).

FIG. 14A represents the relationship between doped Zr concentration and initial resistance. FIG. 14B represents the relationship between Zr concentration and threshold voltage (threshold voltage for writing).

Figure 15:
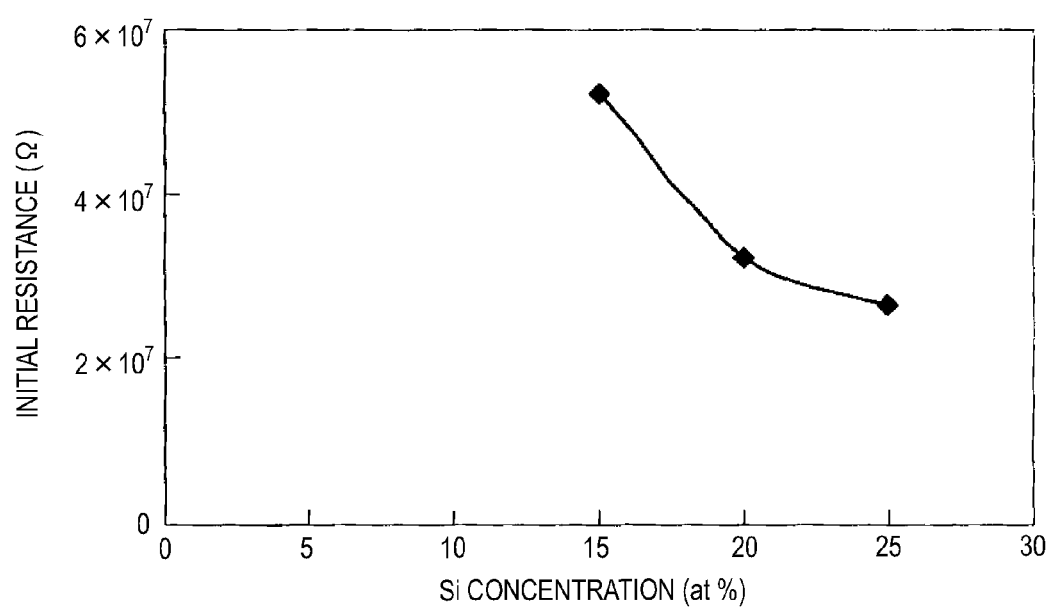
FIG. 15 is a diagram representing the relationship between doped Si concentration in a resistive-change layer and initial resistance.

FIG. 15 represents the relationship between doped Si concentration and initial resistance.

Figure 16A:
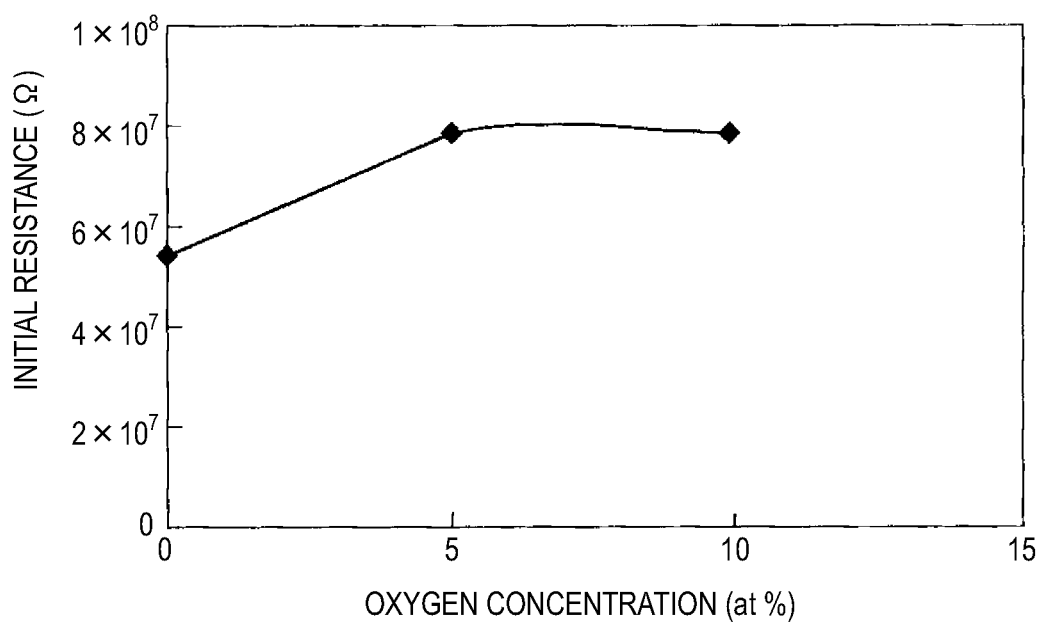
FIG. 16A is a diagram representing the relationship between doped oxygen concentration in a resistive-change layer and initial resistance.
Figure 16B:
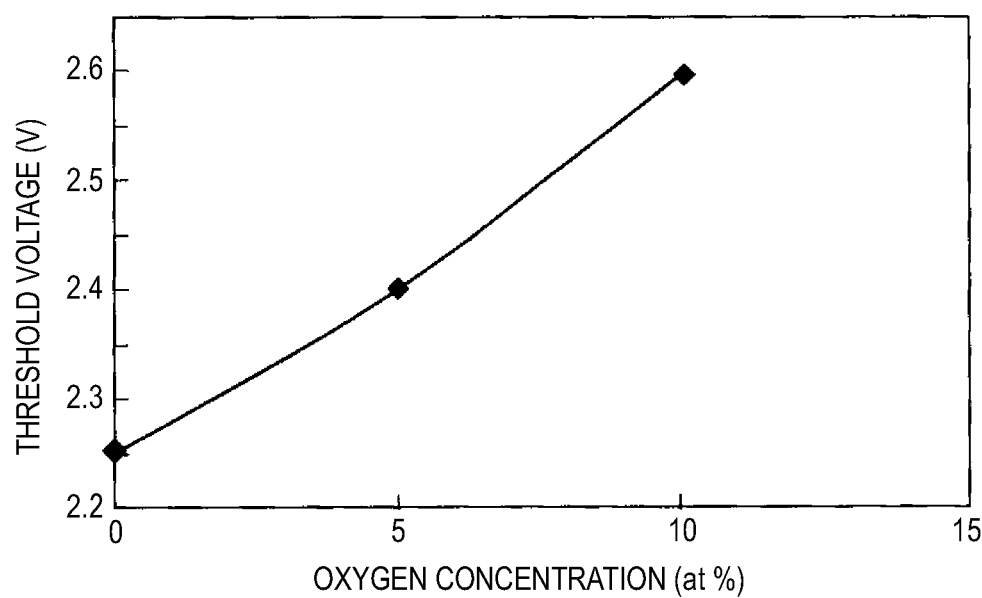
FIG. 16B is a diagram representing the relationship between doped oxygen concentration and threshold voltage (threshold voltage for writing).

FIG. 16A represents the relationship between doped oxygen concentration and initial resistance. FIG. 16B represents the relationship between oxygen concentration and threshold voltage (threshold voltage for writing).

It can be seen from FIGS. 14A and 14B to FIGS. 16A and 16B that the initial resistance and threshold voltage can be varied according to the concentration of the doped material. In Zr doping, initial resistance and threshold voltage tend to decrease as the Zr concentration increases. In Si doping, initial resistance decreases as the Si concentration increases. In oxygen doping, initial resistance and threshold voltage tend to increase as the oxygen concentration increases.

By taking advantage of these changes, a memory element capable of high-speed rewrite operation, and a memory element having a desirable data retention characteristic can be produced upon selecting the doping material and concentration.

In the three types of elements represented in FIGS. 14A and 14B to FIGS. 16A and 16B, it would be possible to produce a memory element capable of high-speed rewrite operation by Zr or Si doping, and a memory element having a desirable data retention characteristic by oxygen doping.

(3) Varying the Dimensions of the Electrode Connected to the Resistive-Change Layer (Memory Layer)

The dimensions of the electrode connected to the resistive-change layer are varied for the first memory element and the second memory element, without varying the configuration of the resistive-change layer.

This configuration is particularly suited for the resistive-change memory elements of a structure in which the resistance value decreases by the formation of a current path inside the resistive-change layer.

It is preferable that the electrode to have different dimensions be directly connected to the resistive-change layer. However, the effect of varying the characteristics of the memory element may also be obtained even in the presence of a very thin layer between the electrode and the resistive-change layer.

The changes in characteristic brought about by varying the dimensions of the electrode become more evident particularly when electrode dimensions are varied in such a manner as to increase the area of the electrode in contact with the resistive-change layer. For example, when the end face of the electrode in contact with the resistive-change layer is rectangular in shape, one of the two opposite sides may be varied while the other remains the same, or both of the two opposite sides may be increased in length. Dimensions may be varied to increase the area also when the end face of the electrode in contact with the resistive-change layer is circular or elliptical. Changes in electrode dimension are unlikely to produce notable characteristic changes when the dimensional changes do not substantially alter the area of the electrode in contact with the resistive-change layer, unless the end face in contact with the resistive-change layer has a greatly different shape.

Increasing the area of the electrode in contact with the resistive-change layer attenuates the electric field applied to the resistive-change layer, and improves data retention characteristic.

Decreasing the area of the electrode in contact with the resistive-change layer causes the electric field to concentrate on a small area, and enables high-speed rewrite operation.

(4) Varying the Material of the Electrode Connected to the Resistive-Change Layer (Memory Layer)

The material of the electrode connected to the resistive-change layer is varied for the first memory element and the second memory element, without changing the configuration of the resistive-change layer.

Because characteristic changes are attained by varying the electrode material, this approach is applicable to a wider range of resistive-change memory element structures, compared with varying the electrode dimensions as in (3).

The effect of varying the characteristics of the memory element can be obtained regardless of whether the electrode to have its material varied is directly connected to the resistive-change layer, or connected to the resistive-change layer via some other layer.

Figure 17A:
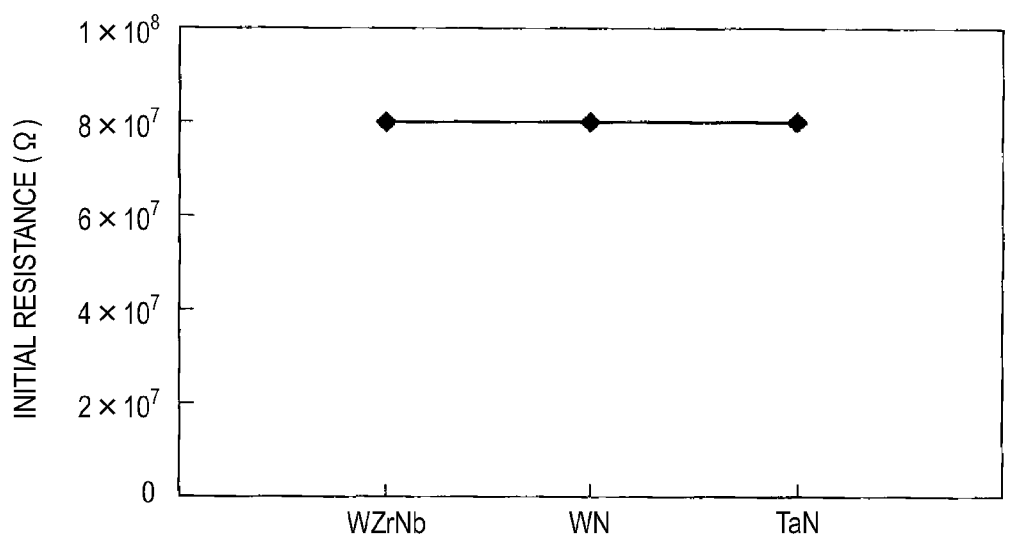
FIG. 17A is a diagram representing changes in initial resistance for different electrode materials.
Figure 17B:
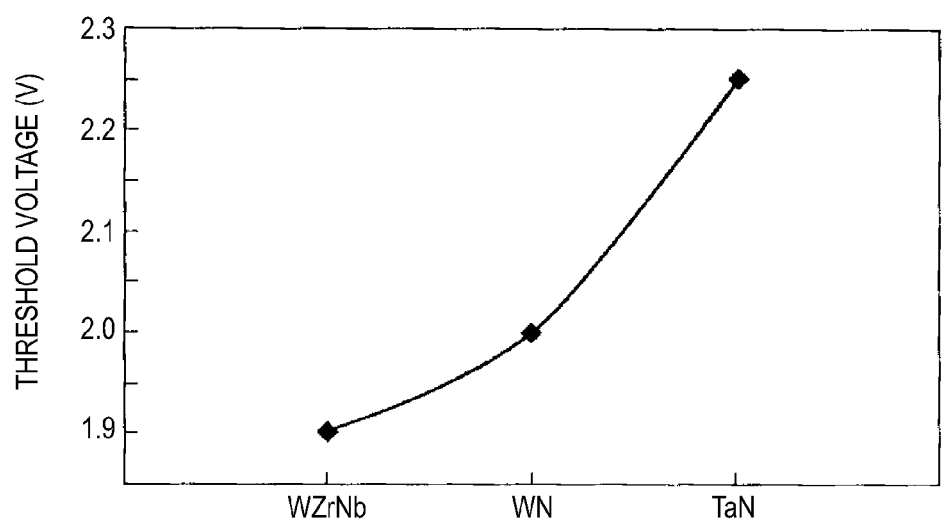
FIG. 17B is a diagram representing changes in threshold voltage (threshold voltage for writing) for different electrode materials.

The resistive-change memory element of the type described above was examined with regard to changes in initial resistance and threshold voltage for writing, using different electrode materials. FIG. 17A represents changes in initial resistance for the three different electrode materials WZrNb, WN, and TaN. FIG. 17B represents changes in threshold voltage (threshold voltage for writing) for these different electrode materials.

As can be seen in FIG. 17A, the initial resistance hardly changes regardless of the electrode material.

As can be seen in FIG. 17B, the threshold voltage (threshold voltage for writing) varies depending on the electrode material.

Thus, only the threshold voltage for writing can be varied by varying the electrode material, without varying the initial resistance.

The invention is not limited to the resistive-change memory element of the type described above, and is applicable to a wide range of memory element structures of the resistive-change memory element.

For example, the invention is also applicable to the ReRAM and PCRAM proposed in the related art.

In the resistive-change memory element of the type described above, the resistive change operation is performed by the resistive-change layer and the resistive-change material supply layer (ion source layer).

This is in contrast to, for example, the ReRAM and PCRAM, in which a single resistive-change layer is generally used for the resistive change operation.

2. First Embodiment

Specific embodiments of the invention will now be described below.

FIG. 1 shows an illustration of a schematic structure (cross sectional view of a relevant portion) of a memory device of First Embodiment of the invention.

The present embodiment is an application of the invention to a resistive-change memory element of the type in which, as described above, the resistive change operation is performed by the resistive-change layer and the resistive-change material supply layer (ion source layer).

The memory device is configured using resistive-change memory elements. The cross section illustrated in FIG. 1 shows an adjacent portion of two memory elements of different characteristics.

Each of these two memory elements is configured to include a resistive-change material supply layer 1, a resistive-change layer 2 or 3, a plug electrode (electrode layer) 4, and a lower electrode 5. The plug electrode (electrode layer) 4 and the lower electrode 5 of each memory element are insulated by an insulating layer 6.

The resistive-change material supply layer 1 is formed on the resistive-change layers 2 and 3, and supplies metallic element ions that cause a resistive change in the resistive-change layers 2 and 3. The resistive-change material supply layer 1 is also called an ion source layer.

The resistive-change layers 2 and 3 undergo changes in resistance as the metallic element ions from the resistive-change material supply layer 1 move in and out of the resistive-change layers 2 and 3.

Note that the resistive-change material supply layer 1 and the resistive-change layers 2 and 3 may be continuously formed between the adjacent memory elements as illustrated in FIG. 1, or may be formed separately.

The plug electrode 4 is connected to the resistive-change layer 2 and 3 underneath these layers.

The lower electrode 5 is connected to the plug electrode 4 underneath the plug electrode 4, and is wider than the plug electrode 4.

Upper electrodes 10A and 10B are provided on the resistive-change material supply layer 1.

The upper electrodes 10A and 10B may be common to the plurality of memory elements, or may be separately formed for the memory elements.

In the memory device of the present embodiment, the resistive-change layer 2 has different thicknesses for the two memory elements, as illustrated in FIG. 1. Specifically, the memory device has the configuration described in (1) above.

In FIG. 1, the resistive-change layer 3 as a thin first resistive-change layer is formed for the left memory element (first memory element), and the resistive-change layer 2 as a thick second resistive-change layer is formed for the right memory element (second memory element).

This configuration allows the left memory element (first memory element) to perform a high-speed rewrite operation, and the right memory element (second memory element) to have desirable a data retention characteristic.

The material of the lower electrode 5 is not particularly limited, and common electrode materials used for semiconductor devices or the like can be used.

Materials such as TiN, W, WZrNb, and TaN can be used for the plug electrode 4.

Materials such as tungsten oxide, $Ta_2O_5$, $Al_2O_3$, $SiO_2$, NiO, CoO, $CeO_2$, and $HfO_2$ can be used for the resistive-change layers 2 and 3.

The resistive-change material supply layer 1 may use metallic materials such as Zr, Cu, and Ag as mobile ions, and chalcogen elements such as S, Se, and Te. The resistive-change material supply layer 1 can be configured to include these two kinds of materials. Specifically, for example, the resistive-change material supply layer 1 may be configured to include at least one kind of element selected from S, Se, and Te, and at least one kind of element selected from Zr, Cu, and Ag.

FIG. 1 illustrates only two types of memory elements of different configurations. However, the memory elements of these different configurations are actually formed in large numbers to configure the memory device. This is also the case in the other embodiments described later.

The memory device of the present embodiment can be fabricated, for example, as follows.

Figure 2A:
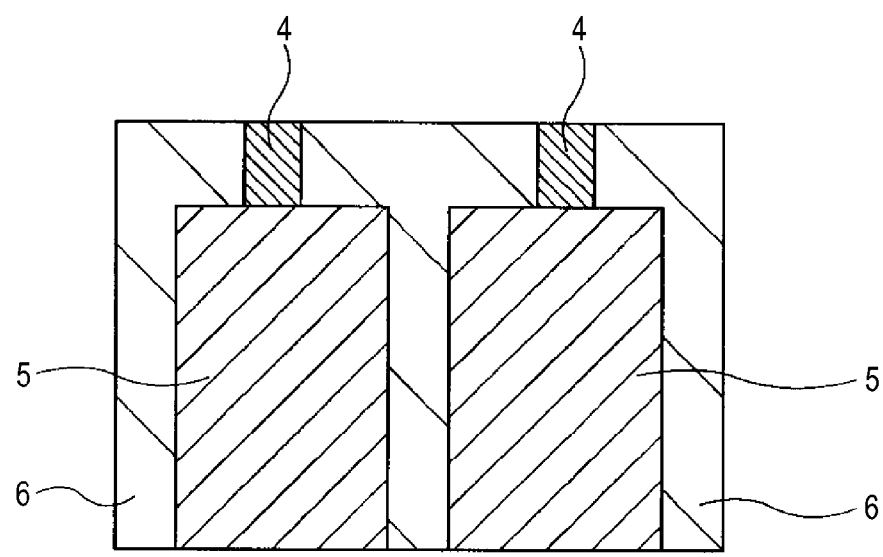
FIGS. 2A and 2B are diagrams representing fabrication steps in a fabrication process of the memory device of FIG. 1.

The fabrication process is described from the state in which the insulating layer 6, the lower electrode 5, and the plug electrode 4 have been formed, as illustrated in FIG. 2A. These members can be formed using known methods.

Figure 2B:
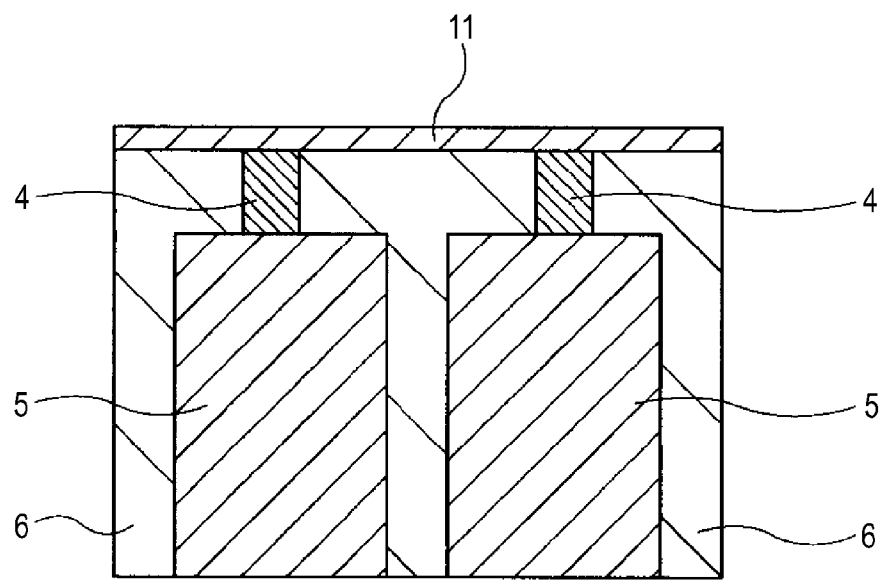

As illustrated in FIG. 2B, a resistive-change material layer 11 is formed over the whole memory region in contact with the plug electrode 4, using a material that becomes the resistive-change layer.

Figure 3C:
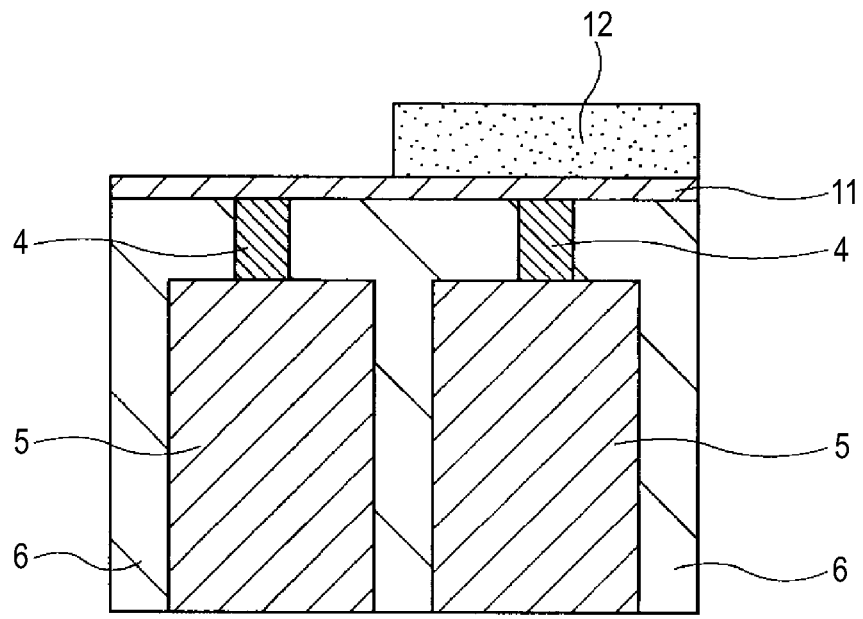
FIGS. 3C and 3D are diagrams representing fabrication steps in a fabrication process of the memory device of FIG. 1.

Then, as illustrated in FIG. 3C, a resist 12 is formed on the pattern covering the right memory element (second memory element), using a photolithography technique.

Figure 3D:
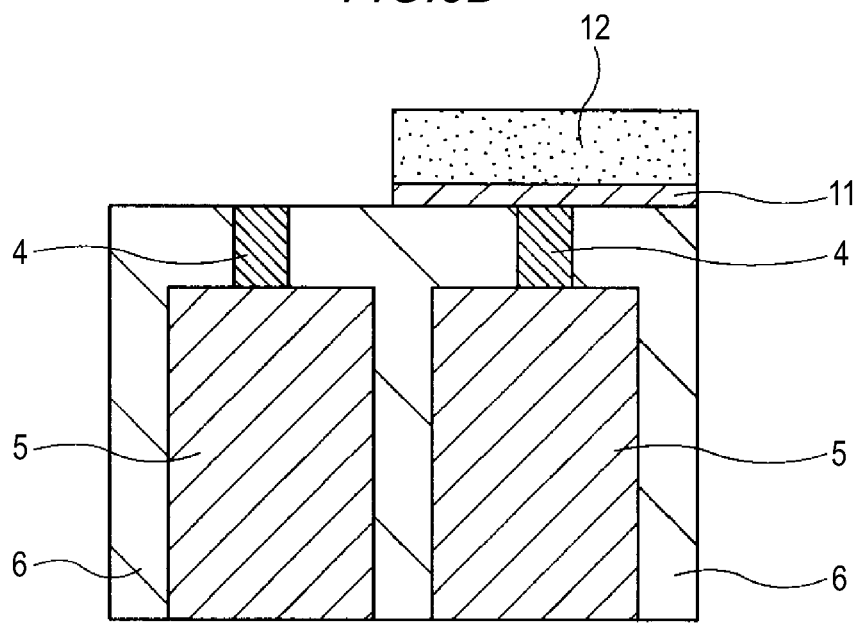

Thereafter, as illustrated in FIG. 3D, the resistive-change material layer 11 on the left memory element (first memory element) portion at a part of the memory region is removed by etching, using the resist 12 as a mask.

Figure 4E:
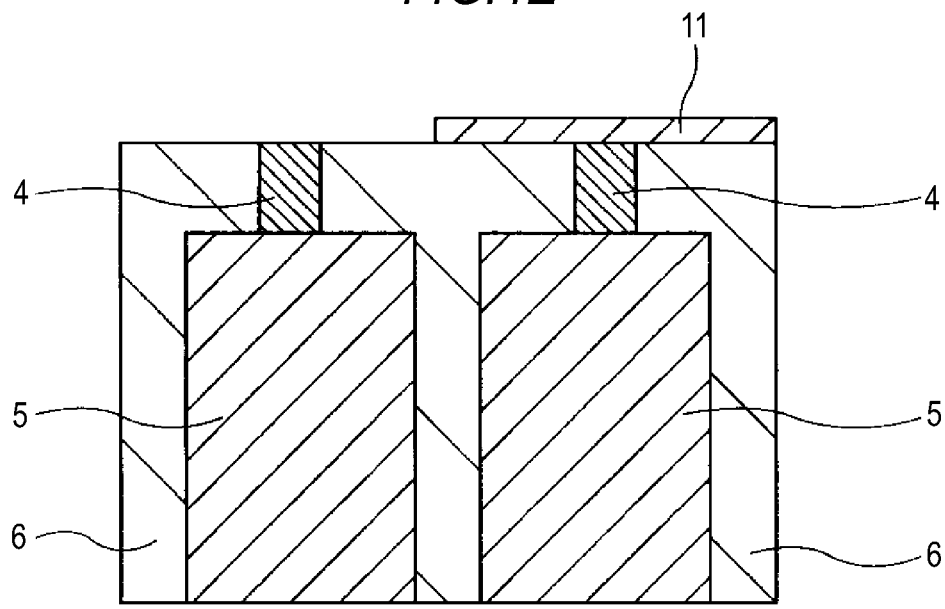
FIGS. 4E and 4F are diagrams representing fabrication steps in a fabrication process of the memory device of FIG. 1.

Then, as illustrated in FIG. 4E, the resist 12 is removed. As a result, the resistive-change material layer 11 remains only on the right memory element portion.

Figure 4F:
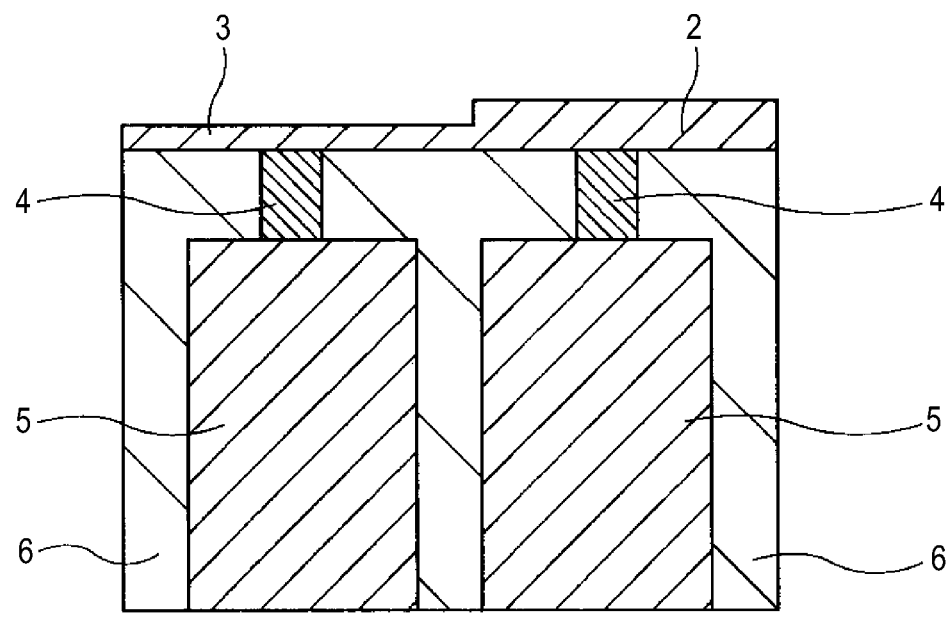

This is followed by deposition of the resistive-change material layer over the whole. As a result, as illustrated in FIG. 4F, the thin first resistive-change layer 3 is formed on the left memory element (first memory element) from which the resistive-change material layer 11 is removed in FIG. 4E. The thick second resistive-change layer 2 is formed on the right memory element (second memory element) from which the resistive-change material layer 11 is not removed in FIG. 4E.

Then, the resistive-change material supply layer 1 is formed over the resistive-change layer 2 and the resistive-change layer 3 of different thicknesses. Here, it is preferable to form the resistive-change material supply layer 1 in such a manner as to eliminate the step difference created by the different thicknesses of the resistive-change layers 2 and 3, and to make the upper surface of the resistive-change material supply layer 1 flat.

Then, the upper electrodes 10A and 10B are formed that are connected to the resistive-change material supply layer 1.

The memory device can be fabricated in this manner, by forming the two memory elements illustrated in FIG. 1.

According to the configuration of the memory device of the present embodiment, because of the different thicknesses of the resistive-change layers 2 and 3 of the two memory elements, rewrite speed is faster and data retention characteristic is lower in the left first memory element having the thin resistive-change layer 3, whereas rewrite speed is slower and data retention characteristic is higher in the right second memory element having the thick resistive-change layer 2. Specifically, the memory device can be configured to include a memory element capable of high-speed rewrite operation, and a memory element having a superior data retention characteristic.

3. Second Embodiment

Figure 5:
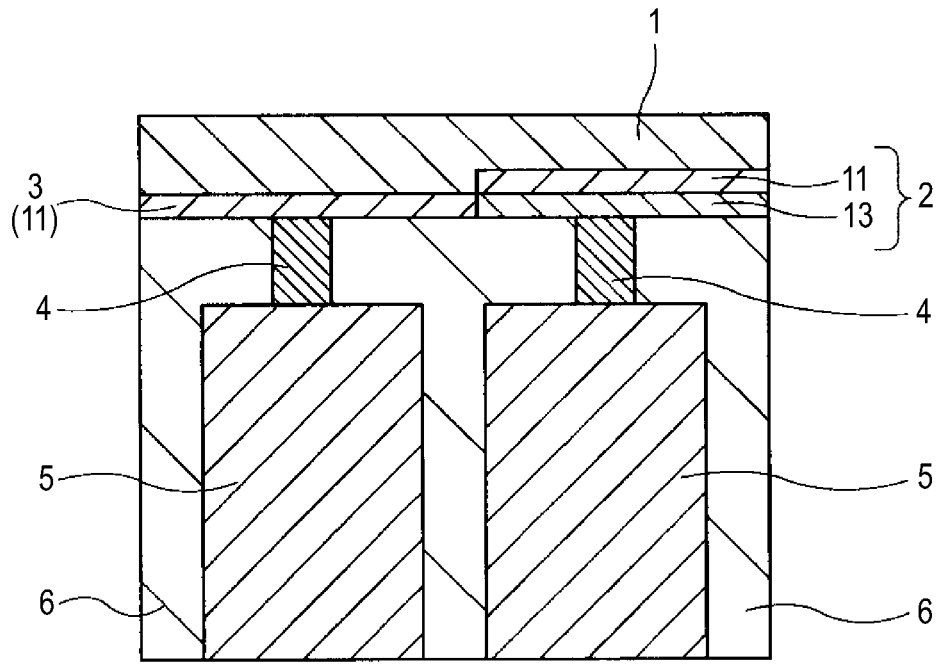
FIG. 5 is a schematic structural view (cross sectional view of a relevant portion) of a memory device of Second Embodiment of the invention.

FIG. 5 shows an illustration of a schematic structure (cross sectional view of a relevant portion) of a memory device of Second Embodiment of the invention.

The cross section illustrated in FIG. 5 shows an adjacent portion of two memory elements of different characteristics.

The basic configuration of the two memory elements is the same as that described in First Embodiment.

In the memory device of the present embodiment, the thicknesses and the materials of the resistive-change layers 2 and 3 are different for the two memory elements illustrated in FIG. 5. Specifically, the memory device has the combination of the configurations described in (1) and (2) above.

In the left memory element (first memory element) of FIG. 5, only the first resistive-change material layer 11 forms the first resistive-change layer 3. In the right memory element (second memory element), the laminate of a second resistive-change material layer 13 and the first resistive-change material layer 11 forms the second resistive-change layer 2.

The second resistive-change material layer 13 has substantially the same thickness as the first resistive-change material layer 11. The second resistive-change layer 2 of the right memory element (second memory element) is about twice as thick as the first resistive-change layer 3 of the left memory element (first memory element).

The resistive-change material layers 11 and 13 are made of different materials, which may be selected from, for example, tungsten oxide, $Ta_2O_5$, $Al_2O_3$, $SiO_2$, NiO, CoO, $CeO_2$, and $HfO_2$.

For example, various levels of high performance and data retention characteristic can be realized by combining materials that are expected to improve data retention characteristic, for example, such as $Ta_2O_5$, $Al_2O_3$, $SiO_2$, NiO, CoO, $CeO_2$, and $HfO_2$.

The same or similar materials described in First Embodiment can be used for the other layers.

The memory device of the present embodiment can be fabricated using the memory device fabrication process described in First Embodiment with reference to FIG. 2A to FIG. 4F.

Specifically, the film formed over the whole memory region in the step of FIG. 2A is replaced with the second resistive-change material layer 13, and the second resistive-change material layer 13 on the left memory element (first memory element) at a part of the memory region is removed in the step of FIG. 3D. Then, the first resistive-change material layer 11 is formed on the second resistive-change material layer 13 in the step of FIG. 4F to form the second resistive-change layer 2 as the bilayer laminate of the resistive-change material layers 13 and 11 in the right memory element (second memory element).

According to the configuration of the memory device of the present embodiment, because the thicknesses and the materials of the resistive-change layers 2 and 3 are different for the two memory elements, rewrite speed is faster and data retention characteristic is lower in the left first memory element with the thin resistive-change layer 3. The right second memory element with the thick resistive-change layer 2 has a slower rewrite speed and a higher data retention characteristic.

Specifically, the memory device can be configured to include a memory element capable of high-speed rewrite operation, and a memory element having a superior data retention characteristic.

4. Third Embodiment

Figure 6:
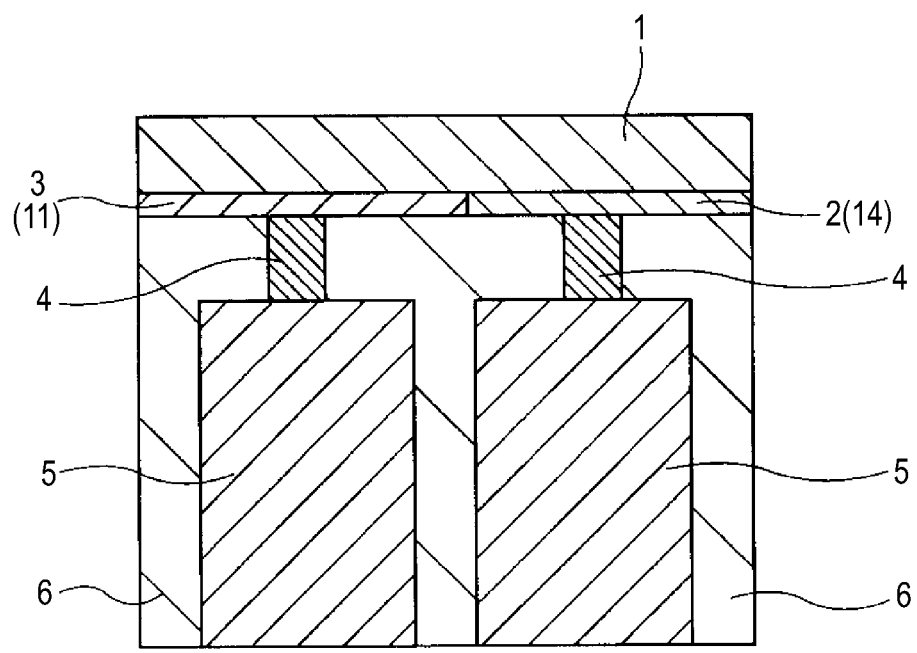
FIG. 6 is a schematic structural view (cross sectional view of a relevant portion) of a memory device of Third Embodiment of the invention.

FIG. 6 shows an illustration of a schematic structure (cross sectional view of a relevant portion) of a memory device of Third Embodiment of the invention.

The cross section illustrated in FIG. 6 shows an adjacent portion of two memory elements of different characteristics.

The basic configuration of the two memory elements is the same as that described in the foregoing embodiments.

In the memory device of the present embodiment, the resistive-change layers 2 and 3 have the same thickness but different materials for the two memory elements illustrated in FIG. 6. Specifically, the memory device has the configuration described in (2) above.

In the left memory element (first memory element) in FIG. 6, only the first resistive-change material layer 11 forms the first resistive-change layer 3. In the right memory element (second memory element), a third resistive-change material layer 14 forms the second resistive-change layer 2.

The material of the third resistive-change material layer 14 is different from that of the first resistive-change material layer 11. Specifically, for example, the material of the third resistive-change material layer 14 includes a new constituent element, or has different proportions of the constituent elements.

The memory device of the present embodiment can be fabricated as follows. After uniformly forming the first resistive-change material layer 11, only the portion that becomes the third resistive-change material layer 14 is doped by, for example, ion implantation to add an additional constituent element, or to vary the proportions of the constituent elements.

Specifically, for example, zirconium, silicon, oxygen, and noble metal can be used as the doping material that contributes to improving the data retention characteristic.

Forming the third resistive-change material layer 14 with these materials improves the data retention characteristic of the right memory element (second memory element) that includes the third resistive-change material layer 14.

According to the configuration of the memory device of the present embodiment, because the materials of the resistive-change layers 2 and 3 are different for the two memory elements, the left first memory element and the right second memory element can have different rewrite characteristics and different data retention characteristics.

In the memory element with the resistive-change layer of a certain material, rewrite speed is faster and data retention characteristic is lower, whereas rewrite speed is slower and data retention characteristic is higher in the memory element having the resistive-change layer of some other material.

Specifically, the memory device can be configured to include a memory element capable of high-speed rewrite operation, and a memory element having a superior data retention characteristic.

In the present embodiment, the first resistive-change layer 3 of the left first memory element and the second resistive-change layer 2 of the right second memory element have the same thickness, and thus the upper surface of the resistive-change layer can be planarized.

As a variation of Third Embodiment, resistive-change layers of different materials may be formed by doping a homogenous resistive-change material layer with different materials.

5. Fourth Embodiment

Figure 7:
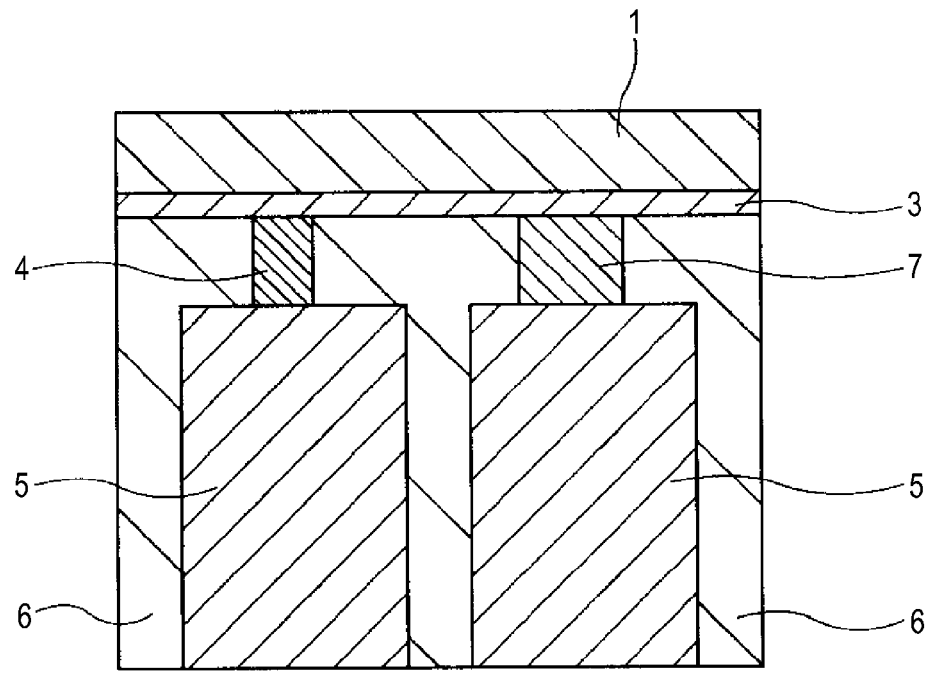
FIG. 7 is a schematic structural view (cross sectional view of a relevant portion) of a memory device of Fourth Embodiment of the invention.

FIG. 7 shows an illustration of a schematic structure (cross sectional view of a relevant portion) of a memory device of Fourth Embodiment of the invention.

The cross section illustrated in FIG. 7 shows an adjacent portion of two memory elements of different characteristics.

The basic configuration of the two memory elements is the same as that described in the foregoing embodiments.

In the memory device of the present embodiment, electrodes of different dimensions are connected to the resistive-change layer 3 that has same configuration for the two memory elements illustrated in FIG. 7. Specifically, the memory device has the configuration described in (3) above.

In the left memory element (first memory element) of FIG. 7, a narrower plug electrode 4 is connected as a first electrode to the resistive-change layer 3. In the right memory element (second memory element), a wider plug electrode 7 is connected as a second electrode to the resistive-change layer 3.

The narrower plug electrode 4 and the wider plug electrode 7 are formed of the same electrode material.

In the left first memory element connected to the narrower plug electrode 4, the plug electrode 4 has a smaller area of contact (contact face) with the resistive-change layer 3. Thus, an electric field concentrates in a small area, and rewrite speed is increased.

In the right second memory element connected to the wider plug electrode 7, the plug electrode 7 has a larger area of contact (contact face) with the resistive-change layer 3. This attenuates the electric field, and data retention characteristic is increased.

In the fabrication of the memory device of the present embodiment, patterns of different aperture sizes may be simultaneously formed by photolithography, or patterns of the same aperture size may be formed first, and the aperture size may be increased by wet etching or the like only in regions where the wider plug need to be formed.

In the present embodiment, because the plug electrodes 4 and 7 of different widths are connected for the two memory elements, the left first memory element and the right second memory element can have different rewrite characteristics and data retention characteristics.

The left first memory element including the narrower plug electrode 4 has a faster rewrite speed and a lower data retention characteristic. Rewrite speed is slower and data retention characteristic is higher in the right second memory element that includes the wider plug electrode 7.

Specifically, the memory device can be configured to include a memory element capable of high-speed rewrite operation, and a memory element having a superior data retention characteristic.

6. Fifth Embodiment

Figure 8:
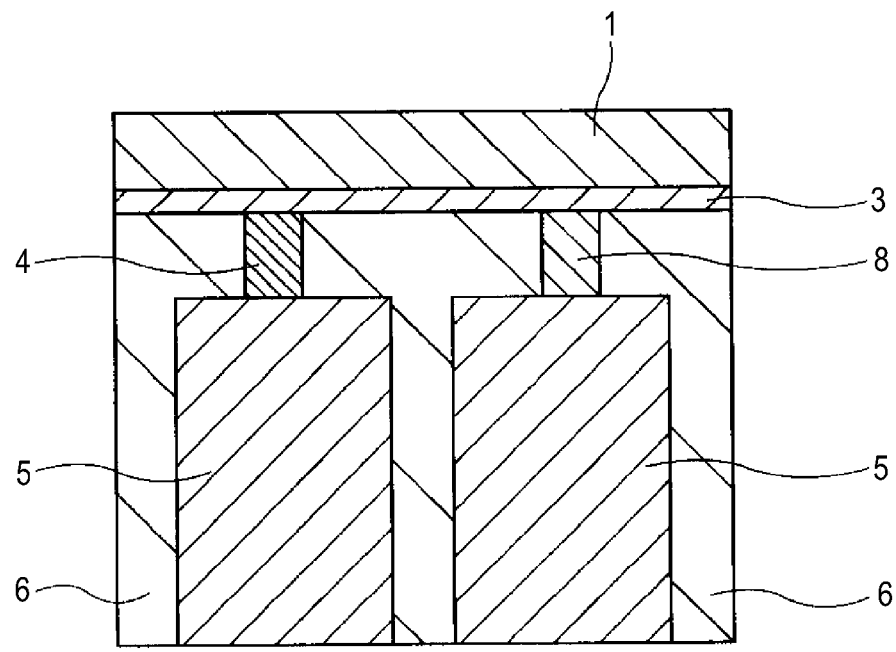
FIG. 8 is a schematic structural view (cross sectional view of a relevant portion) of a memory device of Fifth Embodiment of the invention.

FIG. 8 shows an illustration of a schematic structure (cross sectional view of a relevant portion) of a memory device of Fifth Embodiment of the invention.

The cross section illustrated in FIG. 8 shows an adjacent portion of two memory elements of different characteristics.

The basic configuration of the two memory elements is the same as that described in the foregoing embodiments.

In the memory device of the present embodiment, electrodes of different materials are connected to the resistive-change layer 3 that has the same configuration for the two memory elements illustrated in FIG. 8. Specifically, the memory device has the configuration described in (4) above.

In the left memory element (first memory element) of FIG. 7, the plug electrode 4 of the same material described in the foregoing Fourth Embodiment is connected as a first electrode to the resistive-change layer 3. In the right memory element (second memory element), a plug electrode 8 of a material different from that of the plug electrode 4 is connected as a second electrode to the resistive-change layer 3.

The plug electrode 4 and the plug electrode 8 are formed in substantially the same dimensions.

Examples of the electrode material for the plug electrode include TiN, W, WZrNb, and TaN.

The memory elements of different characteristics can be realized by using these materials with materials that use, for example, Zr, Nb, Mo, and Ta, which are expected to improve data retention characteristic under high resistance.

Assume that a material selected from TiN, W, WZrNb, and TaN is used for one of the plug electrodes 4 and 8, and a material selected from Zr, Nb, Mo, and Ta for the other plug electrode. In this case, the rewrite operation can be performed at relatively high speed in the memory element that includes one of the plug electrodes, while a desirable data retention characteristic can be provided for the memory element that includes the other plug electrode.

The memory device of the present embodiment can be fabricated, for example, as follows.

Figure 9A:
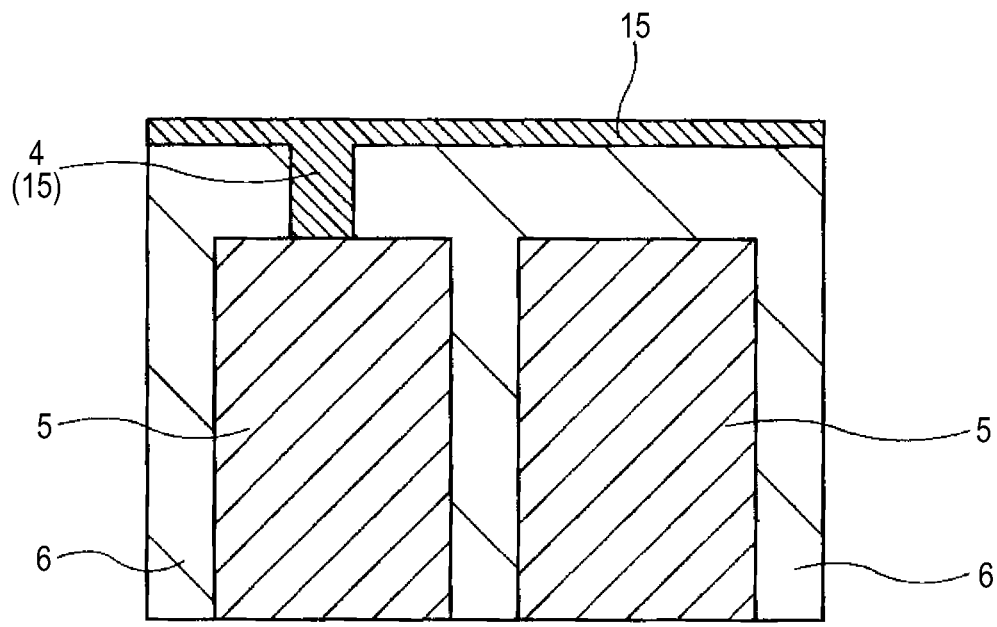
FIGS. 9A and 9B are diagrams representing fabrication steps in a fabrication process of the memory device of FIG. 8.

As illustrated in FIG. 9A, an electrode material layer 15 for the plug electrode 4 is formed over the surface of the insulating layer 6 and in contact with the lower electrode 5 in a region where the left memory element (first memory element) is to be formed. The electrode material layer 15 is not in contact with the lower electrode 5 of the right memory element (second memory element). The electrode material layer 15 in contact with only the lower electrode 5 of the left memory element can be formed by forming an aperture for the plug electrode 4 only in a region where the left memory element to be formed, using photolithography and etching. After forming the aperture (first aperture) in the insulating layer, the electrode material layer 15 of the material for the plug electrode 4 is formed by being plugged in the first aperture.

Figure 9B:
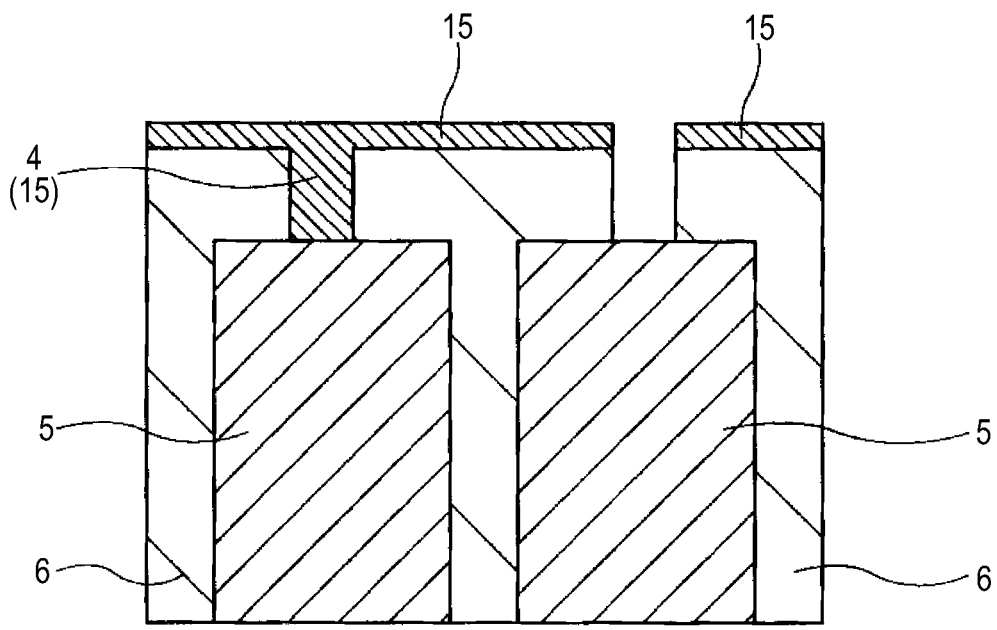

Then, as illustrated in FIG. 9B, an aperture (second aperture) extending from the surface to the lower electrode 5 is formed in a region where the right memory element (second memory element) is to be formed, using photolithography and etching.

Figure 10A:
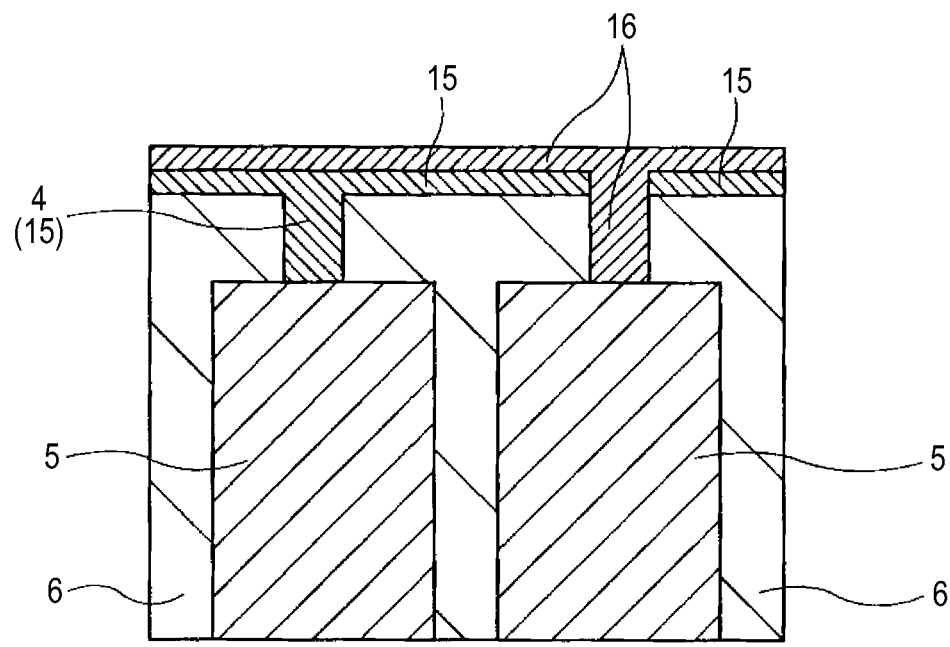
FIGS. 10A and 10B are diagrams representing fabrication steps in a fabrication process of the memory device of FIG. 8.

Thereafter, as illustrated in FIG. 10A, an electrode material layer 16 of a different material from the electrode material layer 15 is formed over the surface so as to plug the second aperture formed on the lower electrode 5 of the right memory element.

Figure 10B:
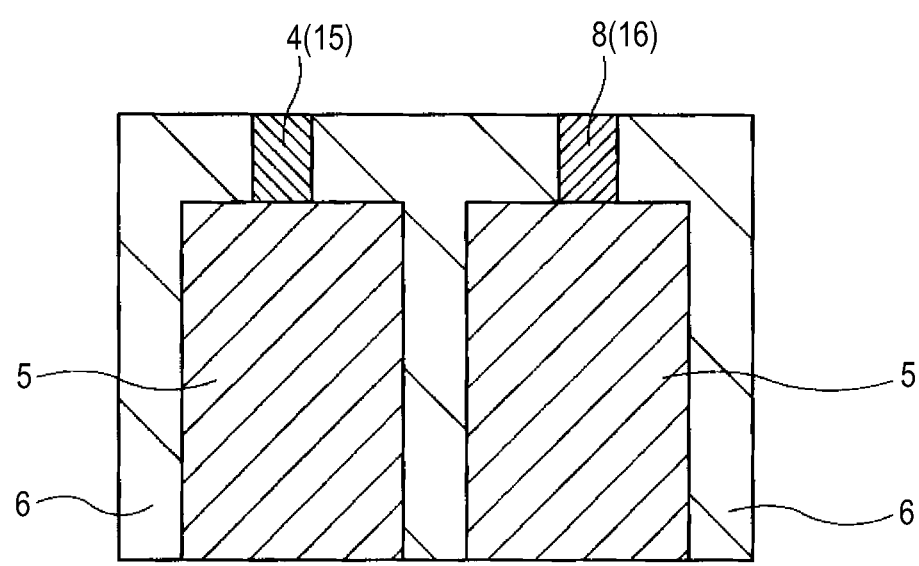

Then, as illustrated in FIG. 10B, the electrode material layer 15 and the electrode material layer 16 on the insulating layer 6 are removed by a method such as polishing. This results in the plug electrode 4 formed from the electrode material layer 15, and the plug electrode 8 formed from the electrode material layer 16.

This is followed by formation of the resistive-change layer 3, the resistive-change material supply layer 1, and the electrodes on the resistive-change material supply layer 1, in this order.

The memory device of FIG. 8 can be fabricated in this manner.

In the memory device of the present embodiment, because the materials of the plug electrodes 4 and 8 connected to the resistive-change layer 3 of the memory elements are different, the left first memory element and the right second memory element can have different rewrite characteristics and data retention characteristics.

In the memory element including the plug electrode of a certain material, rewrite speed is faster and data retention characteristic is lower, whereas rewrite speed is slower and data retention characteristic is higher in the memory element that includes the plug electrode of some different material.

Specifically, the memory device can be configured to include a memory element capable of high-speed rewrite operation, and a memory element having a superior data retention characteristic.

7. Variation

In the foregoing embodiments, two kinds of memory elements of partially different configurations are formed. The invention also includes a memory device configured to include three or more kinds of memory elements of partially different configurations.

In the foregoing embodiments, the two kinds of memory elements of partially different configurations include the resistive-change material supply layer 1 common to these memory elements, and the resistive-change layers 2 and 3 entirely or partly common to these memory elements, and that are formed adjacent to each other.

In the invention, the resistive-change layer and the resistive-change material supply layer may be separately provided for each memory element.

However, in terms of reducing the number of fabrication steps, it is more advantageous to provide the resistive-change material supply layer 1 and/or the resistive-change layers 2 and 3 common to two kinds of memory elements of partially different configurations as in the foregoing embodiments, rather than separately providing these layers for each memory element.

In the foregoing embodiments, the resistive-change layers 2 and 3 are formed on the plug electrodes 4, 7, and 8 separately provided for each memory element, and the resistive-change material supply layer 1 is formed on these layers.

The invention also includes a reversed layer structure in which the resistive-change layer is formed on the resistive-change material supply layer, and the electrode layer separately provided for each memory element is formed on the resistive-change layer.

However, in terms of ease of fabrication, it is more advantageous to form the resistive-change layers 2 and 3 on the plug electrodes 4, 7, and 8 as in the foregoing embodiments, because it enables the electrode to be patterned for each memory element without having adverse effects on the resistive-change layers 2 and 3.

In the foregoing embodiments, the resistive-change material supply layer 1 is formed on the resistive-change layers 2 and 3, and the resistive-change memory elements that undergo resistive changes caused by these two layers are used.

However, the invention is not limited to the resistive-change memory elements of this configuration, and is also applicable to resistive-change memory elements of other configurations. The invention is also applicable to a resistive-change memory element that undergoes changes in resistance caused by only a single resistive-change layer (for example, ReRAM and PCRAM mentioned above).

8. Application

Figure 11:
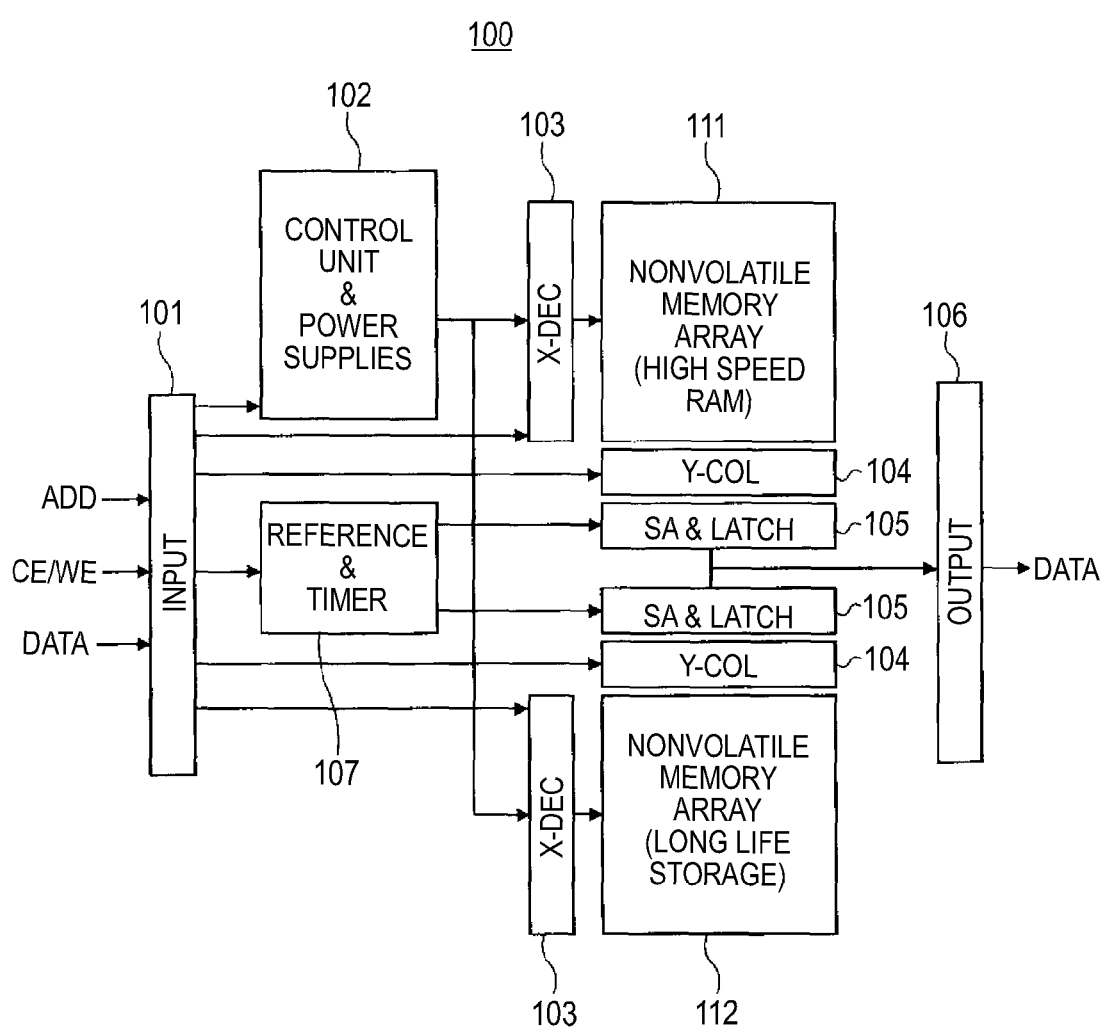
FIG. 11 is a block diagram of a memory device that uses a memory device of an embodiment of the invention.

FIG. 11 shows a block diagram of a memory device that uses a memory device of an embodiment of the invention.

A memory device 100 illustrated in FIG. 11 includes a nonvolatile memory array 111 for high speed RAM, and a long-life-storage nonvolatile memory array 112. The nonvolatile memory arrays 111 and 112 each include an X decoder 103 and a Y column decoder 104. The memory device 100 also includes an input section 101, a control unit circuit-power supply circuit 102, a reference circuit-timer 107, a sense amplifier-latch circuit 105, and an output section 106.

The input section 101 receives data signal DATA, chip enable signal CE, and write enable signal WE.

The high speed RAM nonvolatile memory array 111 and the long-life-storage nonvolatile memory array 112 are structured from two kinds of memory elements, respectively, formed in partially different configurations as described in the foregoing embodiments.

In the circuit block diagram of FIG. 11, the high speed RAM nonvolatile memory array 111 and the long-life-storage nonvolatile memory array 112 are separately disposed.

However, the high speed RAM nonvolatile memory array 111 and the long-life-storage nonvolatile memory array 112 are actually disposed adjacent to each other as in the foregoing embodiments. For example, the nonvolatile memory arrays 111 and 112 are formed in separate regions of a chip, and wired individually.

In the related art, two kinds of memory are required to realize the memory device of such a configuration, for example, by using a DRAM for high-speed RAM, and a long-life-storage flash memory.

In contrast, in the memory device of an embodiment of the invention, the same resistive-change memory element can be used to provide two different types of memory: the nonvolatile memory array 111 and the nonvolatile memory array 112. Thus, a memory device such as that shown in FIG. 11 can be realized at less cost than in the related art, and power consumption can be reduced.

Further, the memory device of an embodiment of the invention allows for selection of different combinations of the thickness and the material, and thus affords more freedom in the design of the memory element with regard to rewrite performance and long-life-storage performance, making it possible to accommodate various structures.

The memory device of the configuration shown in FIG. 11 can be used to, for example, save RAM region data in the long-life-storage nonvolatile memory array 112.

Further, the high speed RAM nonvolatile memory array 111 can be used as an arithmetic region, while the long-life-storage nonvolatile memory array 112 is used as a region for saving security and code.

The invention is not limited to the foregoing embodiments, and may be altered in many ways within the scope of the invention.

The present application contains subject matter related to that disclosed in Japanese Priority Patent Applications JP 2009-245597 filed in the Japan Patent Office on Oct. 26, 2009, the entire contents of which is hereby incorporated by reference.

What is claimed is:

1. A memory device that includes a resistive-change memory element, the memory device comprising:
   a first memory element that includes a first resistive-change layer, a first resistance-change material supply layer and a first electrode connected to the first resistive-change layer; and
   a second memory element that includes a second resistive-change layer, a second resistance-change supply layer and a second electrode connected to the second resistive-change layer,
   wherein,
      at least one of (a) the thickness of the second resistive-change layer and (b) the area of the second electrode in contact with the second resistive-change layer is different from the corresponding one of (a) the thickness of the first resistive-change layer and (b) the area of the first electrode in contact with the first resistive-change layer,
      each of the first and second resistive-change layers is made of a material whose resistance changes when an amount of resistance-change material therein from its respective resistance-change supply material layer changes under the influence of a voltage across the resistance-change layer and its respective resistance-change material supply layer, and
      the first and second memories have different rewrite speeds due to the difference.

2. The memory device according to claim 1, wherein each resistance-change material supply layer is an ion supply layer, and the resistance-change material comprises ions.

3. The memory device according to claim 2, wherein the resistive-change material supply layer includes at least one kind of element selected from S, Se, and Te, and at least one kind of element selected from Zr, Cu, and Ag.

4. The memory device according to claim 1, wherein the thickness and the material of the second resistive-change layer are respectively different from the thickness and the material of the first resistive-change layer.

5. The memory device according to claim 1, wherein the first resistive-change layer and the second resistive-change layer are formed of a material selected from tungsten oxide, $Ta_2O_5$, $Al_2O_3$, $SiO_2$, NiO, CoO, $CeO_2$, and $HfO_2$.

6. The memory device according to claim 1, wherein at least one kind of element selected from zirconium, silicon, oxygen, and noble metal is introduced to the second resistive-change layer.

* * * * *